(12) United States Patent
Luo et al.

(10) Patent No.: US 11,756,596 B1
(45) Date of Patent: Sep. 12, 2023

(54) TRANSITION STRUCTURES FOR THREE-DIMENSIONAL MEMORY ARRAYS

(71) Applicant: Micron Technology, Inc., Boise, ID (US)

(72) Inventors: Shuangqiang Luo, Boise, ID (US); Indra V. Chary, Boise, ID (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/752,332

(22) Filed: May 24, 2022

(51) Int. Cl.
| | |
|---|---|
| *G11C 7/18* | (2006.01) |
| *G11C 7/10* | (2006.01) |
| *H01L 25/065* | (2023.01) |
| *H01L 23/48* | (2006.01) |
| *H10B 99/00* | (2023.01) |

(52) U.S. Cl.
CPC .............. *G11C 7/18* (2013.01); *G11C 7/1027* (2013.01); *H01L 23/481* (2013.01); *H01L 25/0652* (2013.01); *H10B 99/00* (2023.02)

(58) Field of Classification Search
None
See application file for complete search history.

(56) References Cited

U.S. PATENT DOCUMENTS

| | | | | |
|---|---|---|---|---|
| 2017/0243650 | A1* | 8/2017 | Ogawa | H10B 43/10 |
| 2020/0058673 | A1* | 2/2020 | Nishikawa | H10B 43/40 |
| 2020/0357811 | A1* | 11/2020 | Kim | H10B 41/35 |
| 2021/0202703 | A1* | 7/2021 | Rajashekhar | H10B 51/20 |
| 2021/0242241 | A1* | 8/2021 | Rajashekhar | H01L 29/42344 |
| 2021/0408120 | A1* | 12/2021 | Lin | H01L 29/24 |
| 2022/0123008 | A1* | 4/2022 | Lee | H01L 21/76897 |

* cited by examiner

*Primary Examiner* — Tan T. Nguyen
(74) *Attorney, Agent, or Firm* — Holland & Hart LLP

(57) ABSTRACT

Methods, systems, and devices for transition structures for three-dimensional memory arrays are described. A memory device may include a staircase region which includes a set of vias. The set of vias may include a first subset of vias which couple respective word line plates of the memory region with associated word line decoders, and a second subset of vias which are electrically isolated from the word line plates. The second subset of vias may be arranged in one or more rows positioned between the first subset of vias and the memory region. In some cases, the second subset of vias may be positioned above respective conductive contacts. Additionally or alternatively, the second subset of vias may be positioned above a common conductor shared with pillars of the memory region.

25 Claims, 14 Drawing Sheets

SECTION A-A

Unselected Memory Cell 105    Selected Memory Cell 105-a

TOP VIEW

SECTION A-A

US 11,756,596 B1

TRANSITION STRUCTURES FOR THREE-DIMENSIONAL MEMORY ARRAYS

FIELD OF TECHNOLOGY

The following relates to one or more systems for memory, including transition structures for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
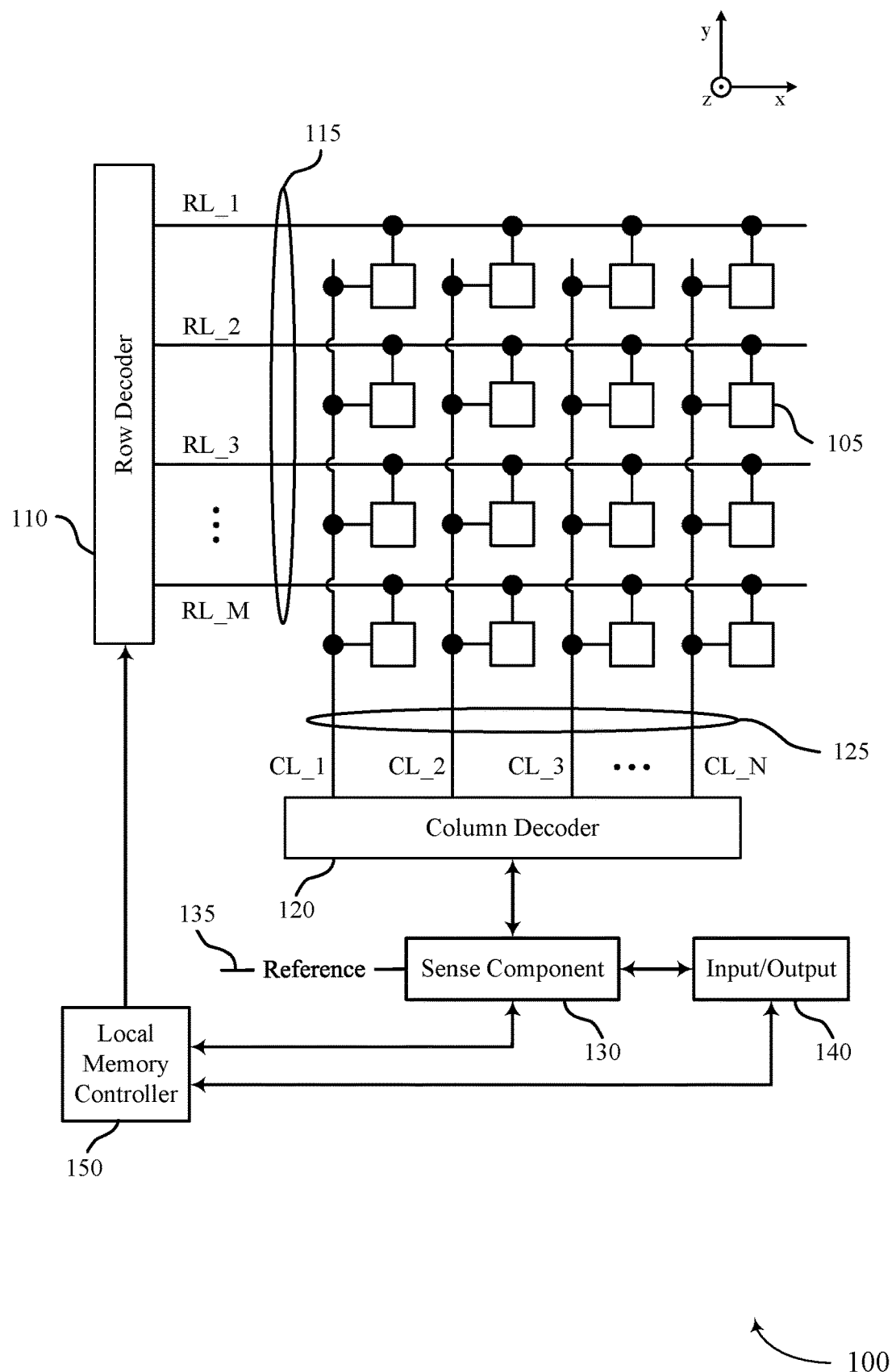
FIG. 1 illustrates an example of a memory array that supports transition structures for three-dimensional memory arrays in accordance with examples as disclosed herein.

In some memory architectures, a memory device may include a memory array arranged in a three-dimensional architecture that includes memory cells arranged in a stack of layers, such an alternating stack of conductive word line plates and insulative dielectric layers. In some such architectures, a memory cell may be coupled with (e.g., coupled physically between, electrically between, or both) a word line plate and a conductive pillar that extends through the levels of the memory array. The memory device may include circuitry that supports the biasing of word lines and conductive pillars such that memory cells of the memory array may be accessed (e.g., logic states may be read from and/or written to the memory cells based on the biasing of respective word lines and conductive pillars). For example, the memory device may include one or more vias extending vertically through the stack of layers configured to bias word line plates as part of an access operation. A via may be positioned above a conductive contact to couple the via to a decoder. In some cases, the set of vias may be arranged in a grid structure, and may include one or more rows and one or more columns. In some examples, a row of vias may adjoin or be in proximity of a memory region of the memory device which includes the memory cells. Additionally, the vias may provide mechanical support to the memory device during manufacturing.

In some cases, as part of manufacturing the memory device, one or more rows of vias near the memory region may tilt toward the memory array due to a build up of charge in the vias. Accordingly, a bottom portion of the one or more rows of vias may tilt towards the memory array and may fail to land on the conductive contact (e.g., the via may experience a falloff), which may cause one or more defects. For example, the exhuming step to create the via cavity may inadvertently exhume other layers or materials during a processing step due to the falloff Accordingly, techniques to mitigate defects due to via tilting are desired.

As described herein, a memory device may include one or more rows of vias which are electrically isolated from word line plates of a memory region of a memory device. For example, a memory device may include a staircase region which includes a set of vias arranged in a grid-formation with one or more rows and one or more columns. The set of vias may include a first subset of live vias which couple respective word line plates of the memory region with associated word line decoders using respective conductive contacts positioned beneath the respective vias, and a second subset of dummy vias which are electrically isolated from the word line plates. The second subset of vias may be arranged in at least one row positioned between the first subset of vias and the memory region. In some cases, the second subset of vias may be positioned above respective conductive contacts. Additionally or alternatively, the second subset of vias may be positioned above a common conductor layer shared with pillars coupled with memory cells of the memory region. Because the second subset of vias are dummy vias, defects such as via tilt associated with the second subset of vias may not result in a defective memory device. Accordingly, the second subset of vias may provide mechanical support to the memory device while mitigating defects due to via tilting.

Features of the disclosure are initially described in the context of memory devices and arrays with reference to FIGS. 1, 2, 3A, and 3B. Features of the disclosure are described in the context of layouts and layered assemblies with reference to FIGS. 4-13. These and other features of the disclosure are further illustrated by and described with reference to an apparatus diagram and flowcharts that relate to transition structures for three-dimensional memory arrays as described with reference to FIG. 14.

FIG. 1 illustrates an example of a memory device 100 that supports transition structures for three-dimensional memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (CO, or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some cases, a memory device 100 may include one or more rows of vias which are electrically isolated from word line plates of a memory region of the memory device 100. For example, a memory device 100 may include a staircase region which includes a set of vias arranged in a grid-formation with one or more rows and one or more columns. The set of vias may include a first subset of live vias which couple respective word line plates of the memory region with associated word line decoders (e.g., row decoders 110 or column decoders 120) using respective conductive contacts positioned beneath the respective vias, and a second subset of dummy vias which are electrically isolated from the word line plates. The second subset of vias may be arranged in at least one row positioned between the first subset of vias and the memory region. In some cases, the second subset of vias may be positioned above respective conductive contacts. Additionally or alternatively, the second subset of vias may be positioned above a common conductor layer shared with pillars coupled with memory cells 105 of the memory region. Because the second subset of vias are dummy vias, defects such as via tilt associated with the second subset of vias may not result in a defective memory device. Accordingly, the second subset of vias may provide mechanical support to the memory device while mitigating defects due to via tilting.

The memory device 100 may include any quantity of non-transitory computer readable media that support transition structures for three-dimensional memory arrays. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
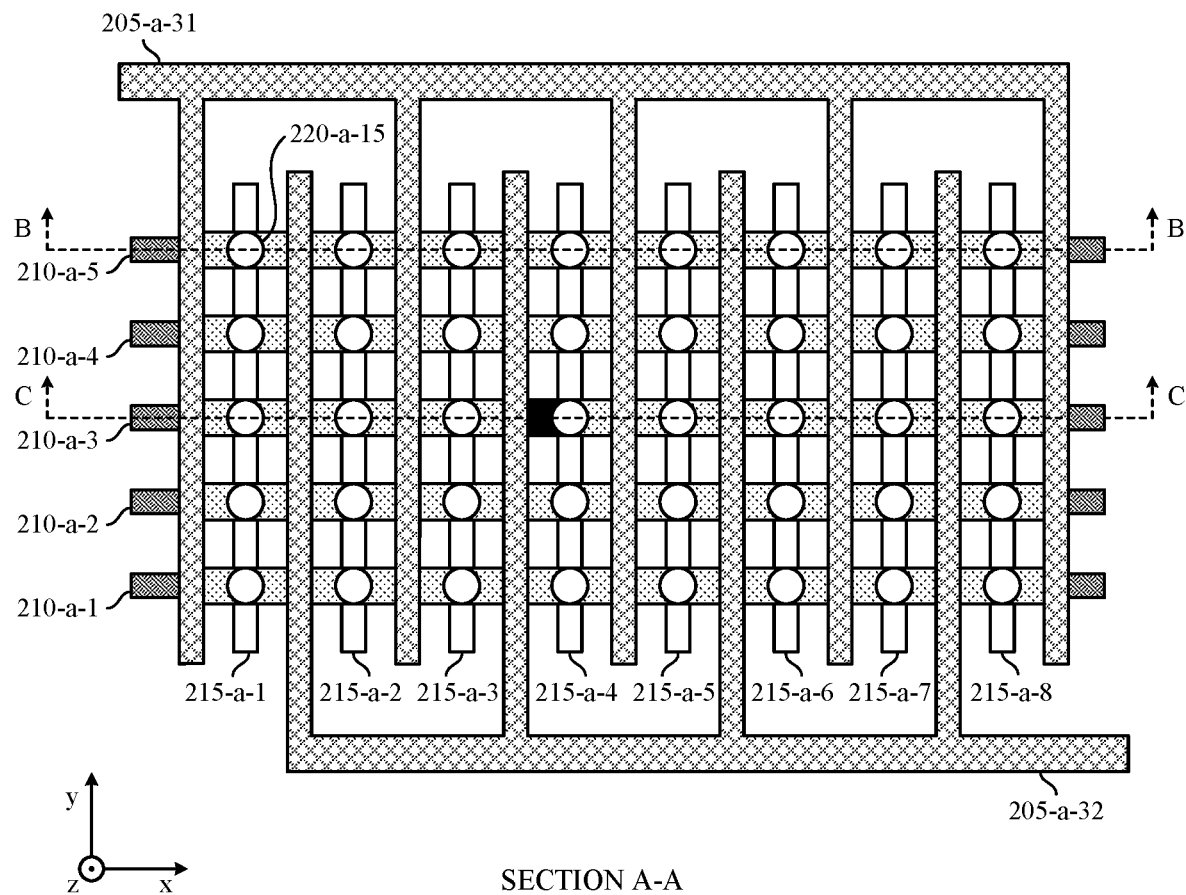
FIG. 2 illustrates a top view of an example of a memory array that supports transition structures for three-dimensional memory arrays in accordance with examples as disclosed herein.
Figure 3A:
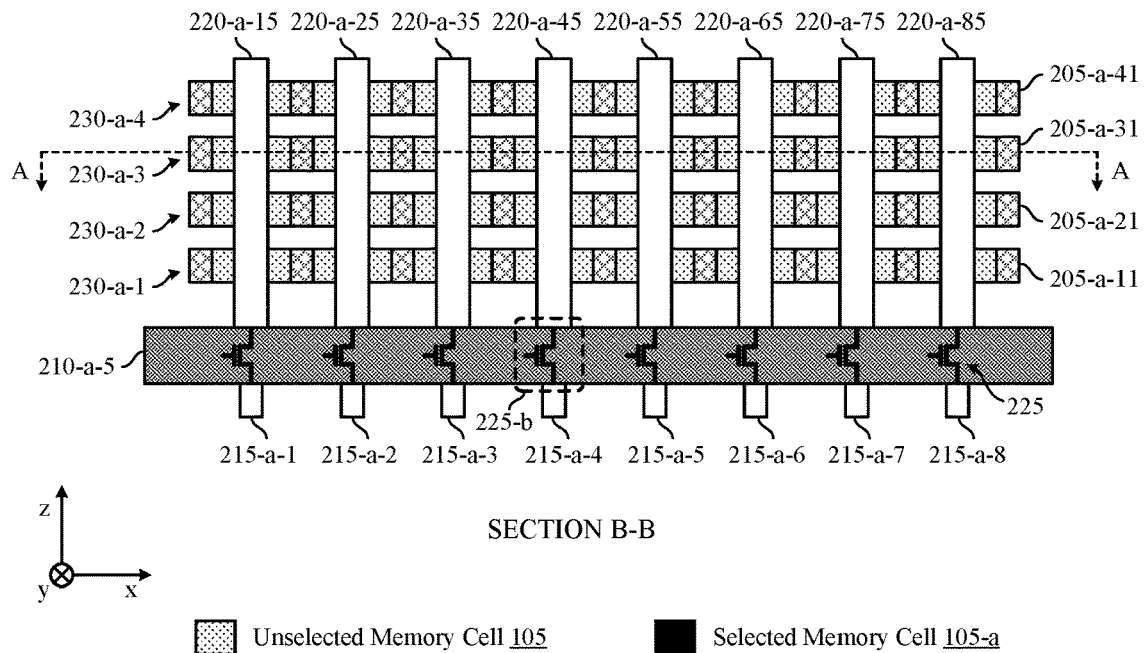
FIGS. 3A and 3B illustrate side views of an example of a memory array that supports transition structures for three-dimensional memory arrays in accordance with examples as disclosed herein.
Figure 3B:
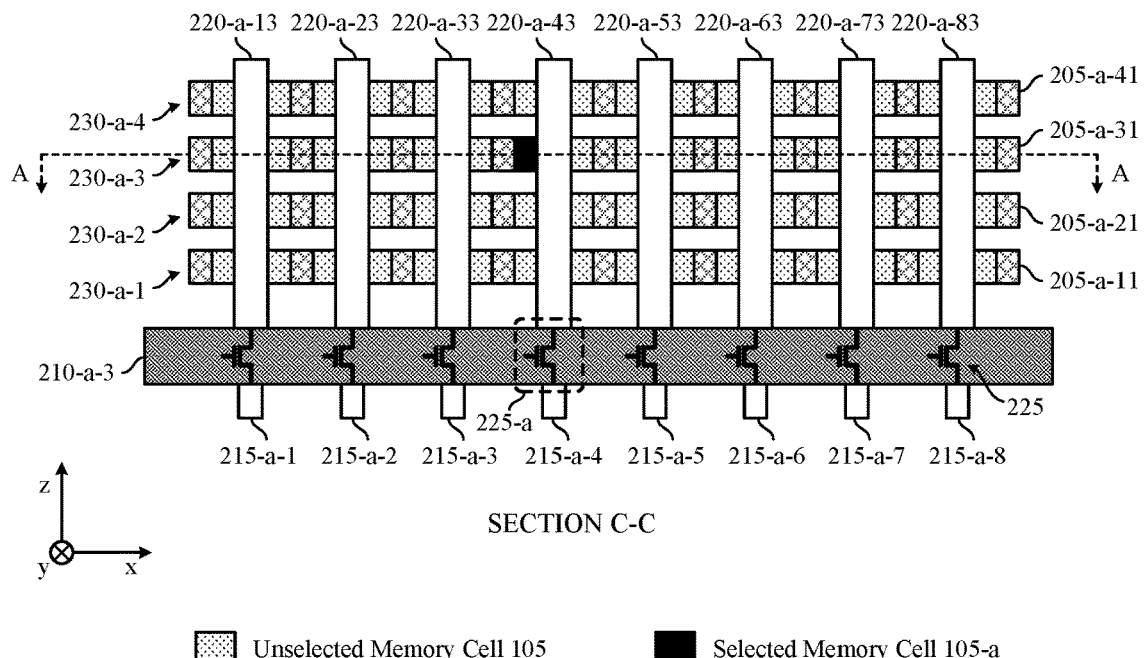

FIGS. 2, 3A, and 3B illustrate an example of a memory array 200 that supports transition structures for three-dimensional memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-*a*-43, the sense line 215-*a*-4 may be biased with the access bias, and the gate line 210-*a*-3 may be grounded (e.g., biased to 0V) or otherwise biased with an activation voltage. In an example where the transistors 225 are n-type transistors, the gate line 210-*a*-3 being biased with a voltage that is relatively higher than the sense line 215-a-4 may activate the transistor 225-*a* (e.g., cause the transistor 225-*a* to operate in a conducting state), thereby coupling the pillar 220-*a*-43 with the sense line 215-*a*-4 and biasing the pillar 220-*a*-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-*a* is activated, or may be coupled with another voltage source (e.g., grounded, via a high-resistance path, via a leakage path) to avoid a voltage drift of the pillars 220. For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (e.g., which may be biased with a ground voltage or may be floating). Further, other unselected gate lines 210, including gate line 210-*a*-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-*b* coupled with the gate line 210-*a*-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some cases, a memory array 200 may include one or more rows of vias which are electrically isolated from word lines 205 of a memory region of a memory array 200. For example, a memory array 200 may include a staircase region which includes a set of vias arranged in a grid-formation with one or more rows and one or more columns. The set of vias may include a first subset of live vias which couple respective word lines 205 of the memory region with associated word line decoders using respective conductive contacts, which may include transistors 225 coupled with sense lines 215, positioned beneath the respective vias, and a second subset of dummy vias which are electrically isolated from the word lines 205. The second subset of vias may be arranged in at least one row positioned between the first subset of vias and the memory region. In some cases, the second subset of vias may be positioned above respective conductive contacts. Additionally or alternatively, the second subset of vias may be positioned above a common conductor layer shared with pillars 220 coupled with memory cells of the memory region. Because the second subset of vias are dummy vias, defects such as via tilt associated with the second subset of vias may not result in a defective memory device. Accordingly, the second subset of vias may provide mechanical support to the memory device while mitigating defects due to via tilting.

Figure 4:
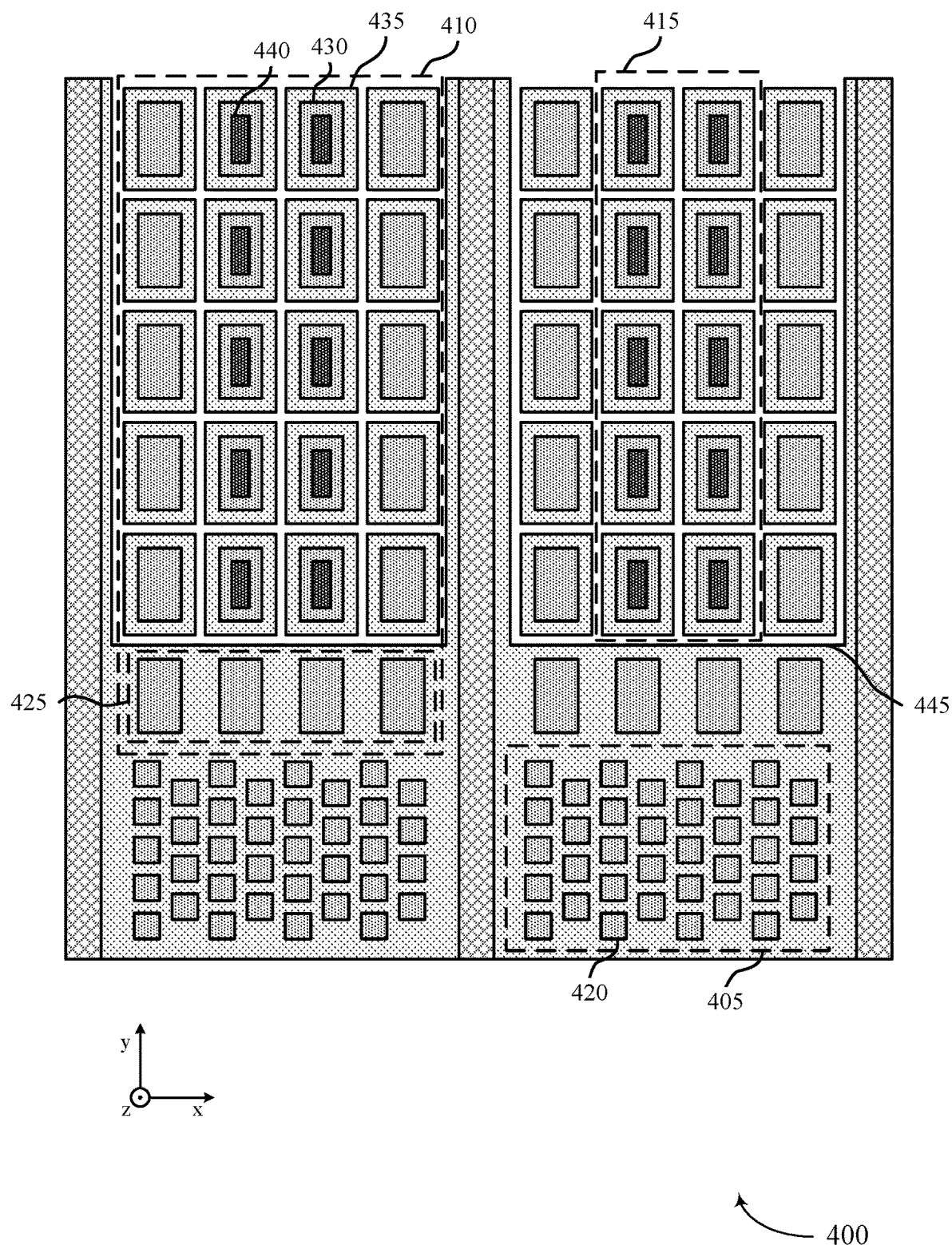
FIG. 4 illustrates an example of a layout that supports transition structures for three-dimensional memory arrays in accordance with examples as disclosed herein.

FIG. 4 illustrates an example of a layout 400 that supports transition structures for three-dimensional memory arrays in accordance with examples as disclosed herein. The layout 400 may include aspects of the memory array 200 described with reference to FIGS. 2, 3A, and 3B. For example, the layout 400 may include one or more pillars 420, which may be examples of a pillar 220 described with reference to FIGS. 2, 3A, and 3B. Each pillar 420 may extend vertically through one or more layers of the memory array depicted in the layout 400, and may each couple with one or more memory cells, such as the memory cells 105 described with reference to FIGS. 2, 3A, and 3B. Accordingly, the pillars 420 and associated memory cells may describe a memory region 405. Aspects of the layout 400 may be described with reference to an x-direction (e.g., a column direction), a y-direction (e.g., a row direction), and a z-direction (e.g., a vertical direction).

The layout 400 depicts a top view of a memory device that may support word line biasing for accessing the memory cells coupled with the pillars 420. For example, the layout 400 may include one or more staircase regions 410. Each staircase region 410 may include one or more staircases, which may include structures that support word line biasing. For example, each staircase may include a configuration of a first set of vias 415 (e.g., electrodes, conductive pillars) that are operable to couple a respective word line structure to a word line decoder (e.g., located below word line structures included in the layout 400). A via 415 may include a conductive pillar 430 which extends vertically through a hole or cavity of a plurality of word line plates of the memory array. In some cases, a via 415 may be arranged above and in contact with an island or conductive contact 435, which may couple the via 415 with a word line decoder (e.g., through a complimentary metal-oxide-semiconductor (CMOS) under array (CuA) structure). In some cases, a via 415 which couples a word line structure to a word line decoder may be referred to as a live via 415. In some cases, the live vias 415 for each staircase may be arranged in a set of rows extending in a first horizontal direction (e.g., the y-direction) and a set of columns extending in a second horizontal direction (e.g., y-direction).

For example, at each level of memory cells along the z-direction, the memory device may include one or more word line structures that each include a word line plate and word line members. A word line plate may be located within or adjacent to a memory region 405 of the layout 400, and each word line member (e.g., of a respective level) may be connected to a word line plate. Each word line member may also extend along a horizontal direction (e.g., in the first horizontal direction, the y-direction) and into a respective memory region 405 of the layout 400.

The word line plate may be operable to bias the word line members in accordance with access operations for memory cells coupled between respective word line members and respective pillars 420. For example, each memory region 405 may include a quantity of pillars 420 along the x-direction and the y-direction and, in some examples, may include a quantity of piers along the x-direction and the y-direction, where the piers may be formed during a manufacturing process of the layout 400 to provide mechanical support for structures in the memory regions 405 during various processing steps of the manufacturing process. Each pillar 420 may be coupled with a first memory cell between a first side of the pillar 420 and a word line member and coupled with a second memory cell between a second side of the pillar 420 and a second word line member that is connected to a second word line plate located at a same level as the word line plate along the y-direction.

In some cases, biasing the word line plate to a voltage may cause the word line members to be biased to the voltage (e.g., or a similar voltage based on the resistance between a via 415 coupled with the word line plate). Accordingly, to bias a word line member to an access voltage (e.g., $V_{access}/2$) in accordance with an access operation for a memory cell (e.g., in which a corresponding pillar 420 is biased to $-V_{access}/2$), the word line plate connected to the word line member may be biased to the access voltage (e.g., or a similar voltage based on the resistance between a via 415 coupled with the word line plate).

In some cases, each via 415 of the first set of vias may be coupled with a contact of a respective word line plate. For example, each word line plate may include a metal contact that enables coupling with a respective metal contact 440 of a via 415. Each via 415 may extend from the contact of the respective word line plate (e.g., vertically) through an opening in the levels above the respective word line plate.

The layout 400 may include a configuration of a second set of vias 425 arranged in an x-y plane and that extend (e.g., vertically) along the z-direction and through holes in the word line plates. The vias 425 may be arranged in one or more rows, one or more columns, or both. For example, the layout 400 may include at least one row of vias 425 arranged between the first set of vias 415 and the memory region 405. In some cases, the layout 400 may include one or more additional rows of vias 425 arranged between the first set of vias 415 and the memory region 405. Additionally, the layout 400 may include one or more columns of vias 425, for example at the edges of the layout 400, such that the vias 415 are arranged between a pair of columns of the vias 425. The vias 425 may provide mechanical support and stability to the memory device (e.g., during manufacturing).

The vias 425 may be electrically isolated (e.g., insulated) from the word line structures, the word line decoders, or both. For example, the vias 425 may include a conductive pillar 430. The vias 425, however, may not include a contact 440, and thus may be isolated from the word line structures, such that a biasing of a word line plate is unaffected by the vias 425. In some cases, the vias 425 may be arranges above and directly in contact with a common conductor 445 shared between the vias 425 and the pillars 420 of the memory region. For example, the common conductor may be a common source plate for the pillars 420, and may be maintained at a substantially constant source voltage. In some cases, the common conductor may include one or more layers of materials, such as alternating layers of an oxide material and a polysilicon material. Additionally or alternatively, the vias 425 may be arranged above and directly in contact with a respective conductive contact 435. In some cases, the vias 425 may be referred to as dummy vias.

Figures 5A, 5B:
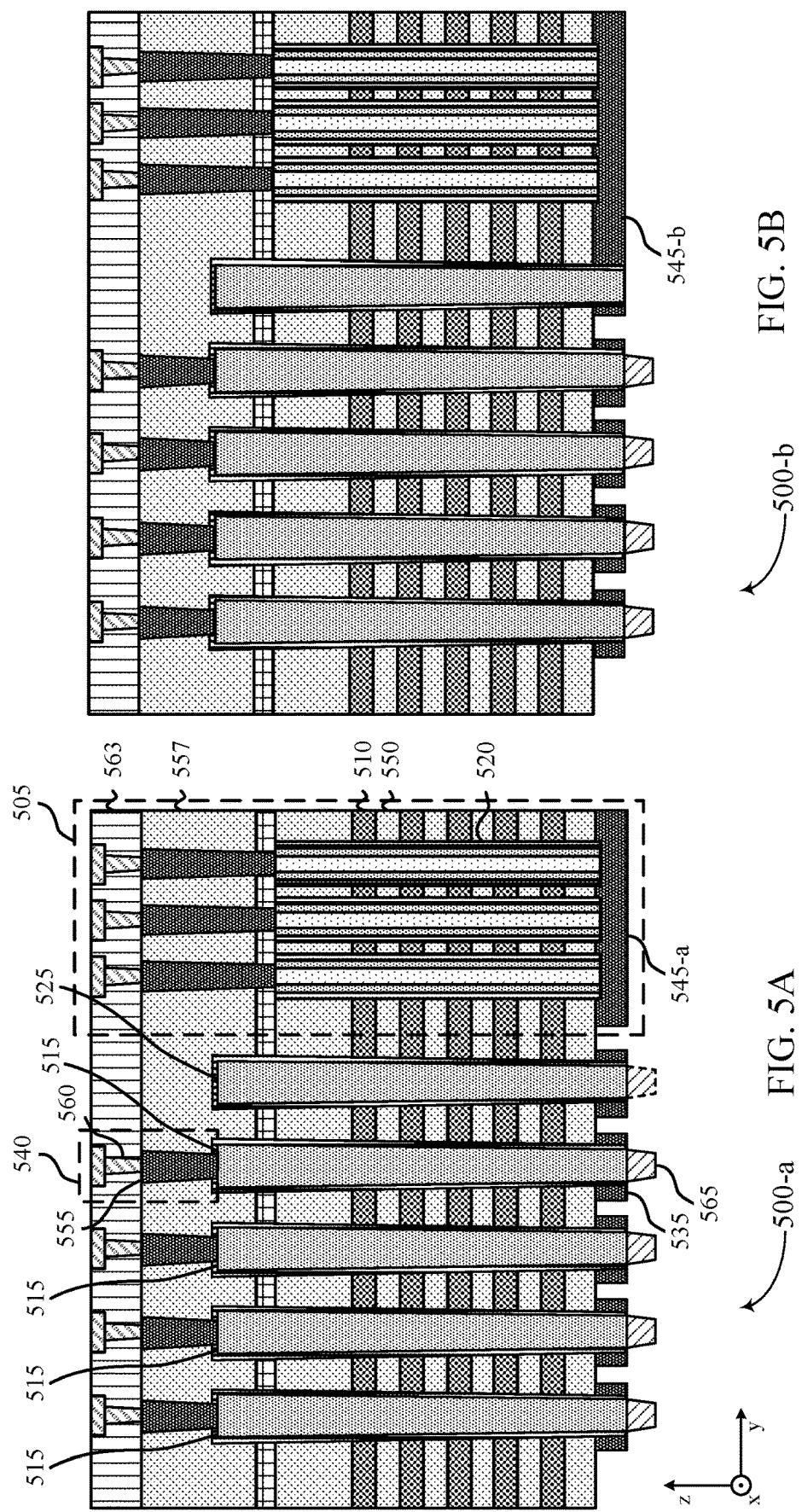
FIGS. 5A and 5B illustrate examples of layouts that support transition structures for three-dimensional memory arrays in accordance with examples as disclosed herein.

FIGS. 5A and 5B illustrate examples of layouts 500-a and 500-b that support transition structures for three-dimensional memory arrays in accordance with examples as disclosed herein. The layouts 500-a and 500-b may include aspects of the memory array 200 described with reference to FIGS. 2, 3A, 3B, and 4. For example, the layouts 500-a and 500-b may depict a cross-sectional view of the layout 400.

The layouts 500-a and 500-b may include one or more pillars 520, which may be examples of a pillar 420 described with reference to FIGS. 4. Each pillar 520 may extend vertically through one or more layers, such as one or more word line plates 510 and one or more dielectric layers 550, and may each couple with one or more memory cells, such as the memory cells 105 described with reference to FIGS. 2, 3A, and 3B. Accordingly, the pillars 520 and associated memory cells may describe a memory region 505. In some cases, the one or more pillars may be positioned above and in contact with a common conductor 545-a or a common conductor 545-b, which may act as a common source for the pillars 520. In such cases, the common conductor 545-a and the common conductor 545-b may include a set of switching components, such as transistors or thin-film transistors (TFTs) to selectively couple a respective pillar 520 with the common conductor 545-a or the common conductor 545-b.

The layouts 500-a and 500-b may include a configuration of a first set of vias 515 (e.g., live vias 515), which may extend vertically through openings or cavities of the one or more word line plates 510 and one or more dielectric layers 550. In some cases, a via 515 may include a conductive material at least partially coated in an insulative material such as a liner dielectric, such that a via 515 may not directly contact the one or more word line plates 510. Rather, an upper surface of each via 515 may couple with as a metal contact 540 (e.g., using a portion of the conductive material not coated in the insulative material). The layouts 500-a and 500-b may include an additional layer (not shown) to respectively couple the metal contacts 540 with contacts of respective word line plates 510 to support biasing the word line plates 510.

In some cases, a metal contact 540 may include one or more additional vias, such as a first via 555 arranged below and in contact with a second via 560. The first via 555 may include a first conductive material and may be formed in a first oxide layer 557. Additionally or alternatively, the second via 560 may include a second conductive material and may be formed in a second oxide layer 563.

Each of the first set of vias 515 may be coupled with one or more word line decoders (not shown) positioned beneath the layouts 500-a and 500-b. For example, each via 515 may be positioned on an island or conductive contact 535, and a bottom surface of a via 515 may be coupled with a respective via 565. In some cases, a conductive contact 535 may overhang a respective via 565, as depicted in FIGS. 5A and 5B. The vias 565 may respectively couple with the word line decoders, and may, in some cases, run through a CuA circuit architecture.

The layouts 500-*a* and 500-*b* may include a configuration of a second set of vias 525 which may extend vertically through openings or cavities of the one or more word line plates 510 and one or more dielectric layers 550. The vias 525 may be arranged in one or more rows, one or more columns, or both. For example, the layouts 500-*a* and 500-*b* may include at least one row of vias 525 arranged between the first set of vias 515 and the memory region 505. In some cases, a via 525 may include a conductive material at least partially coated in an insulative material (e.g., a liner dielectric), such that a via 525 may not directly contact the one or more word line plates 510. The vias 525 may be electrically isolated from the one or more word line plates 510. For example, a via 525 may not include a metal contact 540, such that there may not be a conductive path between the vias 525 and a word line plate 510.

In some cases, a via 525 may be positioned on an island or conductive contact 535, as depicted in FIG. 5A, and a bottom surface of a via 525 may be coupled with a respective via 565. In some cases the via 565 coupled with a via 525 may be disconnected from the circuits (e.g., CuA circuits) forming the word line decoder.. Alternatively, a conductive contact corresponding to the via 525 may not include a via 565, and thus an insulating layer may be between the conductive contact 535 and the CuA circuits below the via 525. Additionally or alternatively, the second set of vias 525 may be positioned on the common conductor 545-*b*, as depicted in FIG. 5B. For example, the common conductor 545-*b* may merge with a set of conductive contacts 535 corresponding to the second set of vias 525.

FIGS. 6 through 13 illustrate examples of operations that support transition structures for three-dimensional memory arrays in accordance with examples as disclosed herein. For example, FIGS. 6 through 13 may illustrate aspects of a sequence of operations for fabricating aspects of a memory device and supporting circuitry, which may be a portion of a memory device (e.g., a portion of a memory device 100, a portion of a memory array 200, a portion of a memory die, a layout 400, a layout 500-*a*, a layout 500-*b*, or any combination thereof). Each view of the figures may be described with reference to an x-direction, a y-direction, and a z-direction, as illustrated, which may correspond to the respective directions described with reference to the memory array 200. Some of the provided figures include section views that illustrate example cross-sections of the memory device at various stages of manufacturing. For example, in FIGS. 6 through 13, a view "SECTION A-A" may be associated with a cross-section in an xz-plane (e.g., in accordance with a cut plane A-A) through a portion of the memory device, and a view "SECTION B-B" may be associated with a cross-section in an xz-plane (e.g., in accordance with a cut plane B-B) through a portion of the memory device. Although the memory device illustrates examples of certain relative dimensions and quantities of various features, aspects of the layered assembly 600 may be implemented with other relative dimensions or quantities of such features in accordance with examples as disclosed herein.

Operations illustrated in and described with reference to FIGS. 6 through 13 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 6:
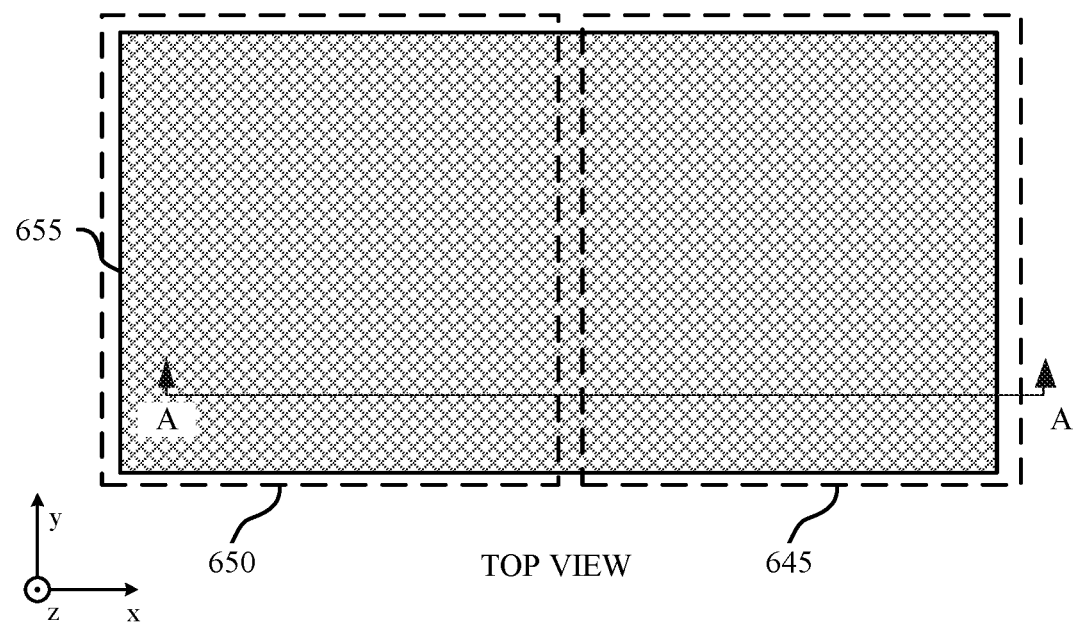
FIG. 6 illustrates an example of a layout that supports transition structures for three-dimensional memory arrays in accordance with examples as disclosed herein.
Figure 6:
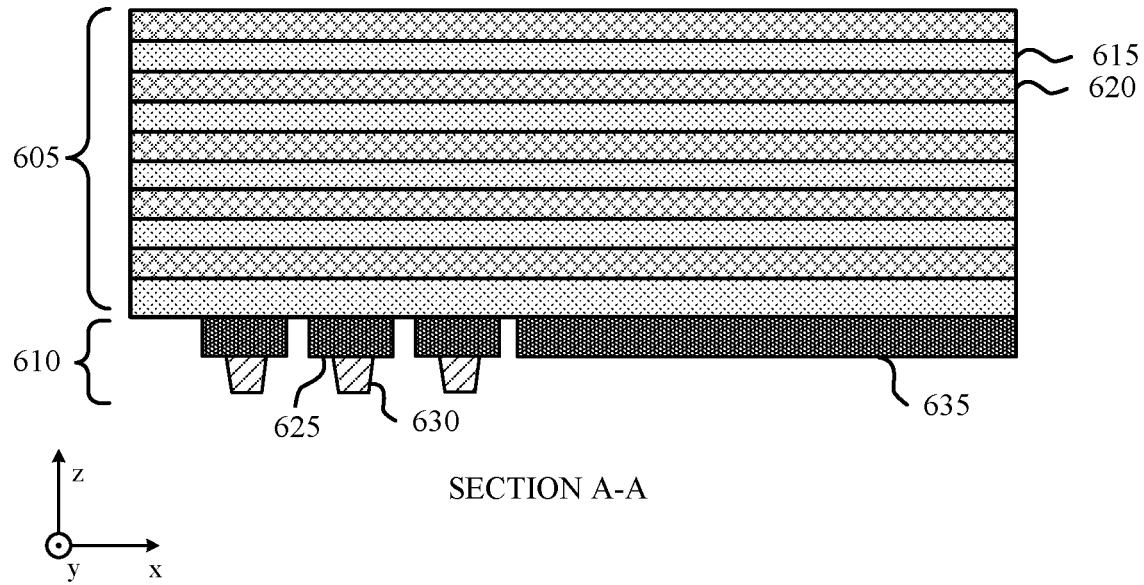

FIG. 6 illustrates an example of a top view and a cross-sectional view of a layered assembly 600 that supports transition structures for three-dimensional memory arrays in accordance with examples as disclosed herein. A set of manufacturing operations may include depositing a stack of layers 605 over a substrate 610. The substrate 610 may include a set of conductive contacts 625 and a common conductor 635, which may be examples of the conductive contacts 535 and the common conductors 545-*a* or 545-*b* as described with reference to FIGS. 5A and 5B. The conductive contacts 625 may be arranged in a grid, which may include one or more rows (e.g., in the y-direction) of conductive contacts 625, one or more columns (e.g., in the x-direction) of conductive contacts, or both.

In some cases, a first subset of the conductive contacts 625 may include a via 630, which may be an example of the via 565. Additionally, the memory device may include a second subset of conductive contacts 625. In some cases, the second set of conductive contacts 625 may include a respective via 630. Alternatively, the second set of conductive contacts 625 may not include a respective via 630. The second subset of conductive contacts 625 may include one or more rows, one or more columns, or both. For example the second subset of conductive contacts 625 may include at least one row of conductive contacts 625 positioned between the first subset of conductive contacts 625 and the common conductor 635.

The substrate 610 may further include or be positioned above a semiconductor wafer or other substrate over which the stack of layers 605 is deposited. In some examples, the layered assembly 600 may include other materials or components between the stack of layers 605 and the semiconductor wafer, such as interconnection or routing circuitry (e.g., access lines, sense lines 215, gate lines 210), control circuitry (e.g., transistors 225, aspects of a local memory controller 150, decoders, multiplexers), or another stack of layers 605 (e.g., another stack of layers 605 has been processed in accordance with examples as disclosed herein), which may include various conductor, semiconductor, or dielectric materials between the stack of layers 605 and the substrate 610. For example, the layered assembly 600 may include a layer including TFTs between the substrate 610 and the stack of layers 605, such as transistors 225, among others. In some examples, the substrate 610 itself may include such interconnection or routing circuitry.

The stack of layers 605 may include alternating layers of a first material 615 and a second material 620 (e.g., in accordance with alternating material deposition operations). In some examples, the first material 615 may include a dielectric material (e.g., a first dielectric material), such as an oxide (e.g., a tier oxide), and may provide electrical isolation between levels 230. The second material 620 may include various materials that are different than the first material 615, which may support differential processing (e.g., differential etching, high selectivity). For example, the layers of the second material 620 may be sacrificial layers. In some examples, the second material 620 may be a dielectric material, such as a nitride (e.g., a tier nitride). Although the stack of layers 605 is illustrated with ten layers (e.g., five layers of the first material 615 and five layers of the second material 620), a stack of layers 605 in accordance with examples as disclosed herein may include any quantity of layers of each of two or more materials (e.g., tens of layers, hundreds of layers, and so on).

The stack of layers 605 may be deposited in a memory region 645 and a staircase region 650, which may be examples of a memory region 405 and a staircase region 410, respectively, as described with reference to FIG. 4. Additionally, the top view 655 of the memory device may illustrate a view of the layered assembly 600 at a level corresponding to the second material 620.

Figure 7:
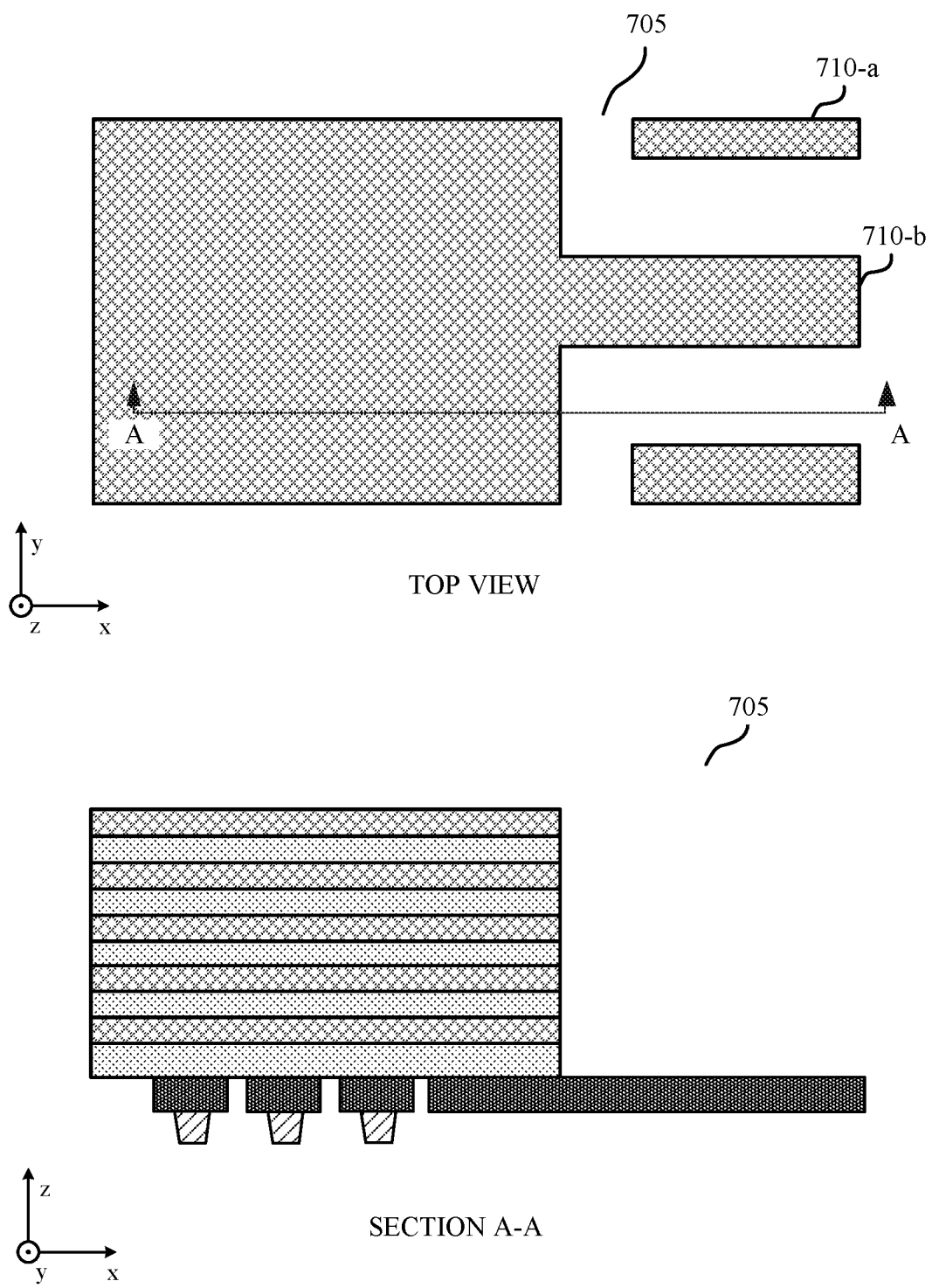
FIG. 7 illustrates an example of a layout that supports transition structures for three-dimensional memory arrays in accordance with examples as disclosed herein.

FIG. 7 illustrates an example of a top view and a cross-sectional view of a layered assemble 700 that supports transition structures for three-dimensional memory arrays in accordance with examples as disclosed herein. The set of manufacturing operations may also include operations (e.g., comb patterning operations) that support forming an interleaved pair of comb structures. For example, the set of manufacturing operations may include depositing a masking material (e.g., a comb hardmask) over the portions of the stack of layers 605 (e.g., over a top layer of the stack of layers 605), such as the memory region 645. In some examples, the masking material may be deposited at least partially in a comb pattern (e.g., as viewed in an xy-plane).

The set of manufacturing operations may also include further operations (e.g., comb etch operations) that support forming an interleaved pair of comb structures 710. For example, the set of manufacturing operations may include removing (e.g., etching) portions of the stack of layers 605 between the previously-deposited masking material (e.g., along the z-direction, to the substrate 610 or to an intervening material between the stack of layers 605 and the substrate 610), which may form a set of cavities 705 in the memory region 645.

Forming the set of cavities 705 may define a set of interleaved comb structures, such as a first comb structure 710-a and a second comb structure 710-b. In some cases, each comb structure of the set of interleaved comb structure may include a set of "teeth" or tines extending horizontally (e.g., in the x-direction) from a base. The tines of the first comb structure 710-a may alternate (e.g., in the y-direction) with the tines of the second comb structure 710-b. The set of interleaved comb structures may correspond to one or more word line plates (e.g., the first comb structure 710-a may correspond to a first word line plate, and the second comb structure 710-b may correspond to a second word line plate).

Figure 8:
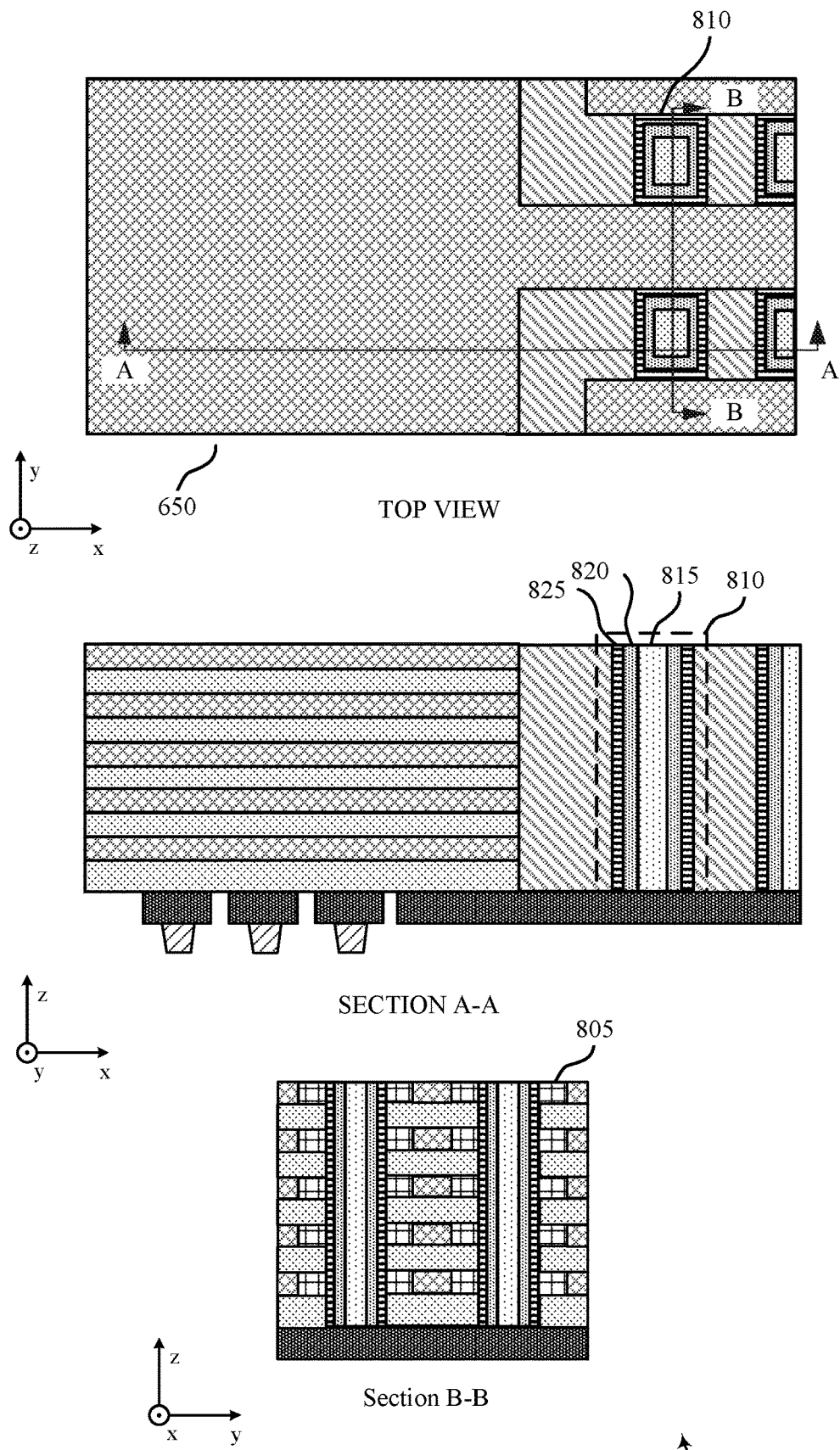
FIG. 8 illustrates an example of a layout that supports transition structures for three-dimensional memory arrays in accordance with examples as disclosed herein.

FIG. 8 illustrates an example of a top view and a cross-sectional view of a layered assembly 800 that supports transition structures for three-dimensional memory arrays in accordance with examples as disclosed herein. The set of manufacturing operations may include forming a set of memory cells 805, for example by performing an etching operation to form a set of voids in the second material 620 and depositing a storage material in each of the voids. In some cases, the storage material may be a material configured to store a logic state of a memory cell, such as a chalcogenide glass or a chalcogenide alloy. In some examples, the storage material may initially be deposited to be in contact with both of the interleaving comb structures 710. Accordingly, after being deposited, the storage material may be in contact with a plurality of word line members. In some examples, prior to depositing the storage material, the set of manufacturing operations may include pretreating the set of voids, for example by depositing a sealing layer, such as an ammonia ($NH_3$) layer.

The set of manufacturing operations may also include a recess or etch of the storage material to form a set of memory cells 805 in each of the voids. In some cases, the set of manufacturing operations may also include depositing a sealing material, which may be an example of a dielectric material, in the set of voids. In some cases, the sealing material may be deposited in contact with each memory cell 805 of each voide. In some examples, the sealing material may additionally cover the exposed layers of the first material 615.

In some cases, the set of manufacturing operations may include operations (e.g., a gapfill operation) that support forming pillars (e.g., pillars 220, pillars 420) in the set of cavities 705. For example, the set of manufacturing operations may include depositing the electrode material 820, a ceramic material 825, and a metallic material 815 in the set of cavities 705 of the memory region 645 to form pillars 810. In some examples, the electrode material 820 may be etched after its deposition and prior to deposition of the ceramic material 825 and the metallic material 815 to expose the common conductor 635 such that the ceramic material 825 in the cavities 705 and the metallic material 815 in the cavities 705 may be in contact with the common conductor 635.

In some examples, the ceramic material 825 may be an example of titanium nitride (TiN), and may act as a barrier between the metallic material 815 and the other materials. In some examples, the metallic material 815 may be an example of conductive material, such as tungsten (W), and may form the conductive portion of the pillars 810 (e.g., the pillars 220, the pillars 420). In some examples, the pillars 810 formed in the cavities 705 may be electrically isolated from the word line plates.

Figure 9:
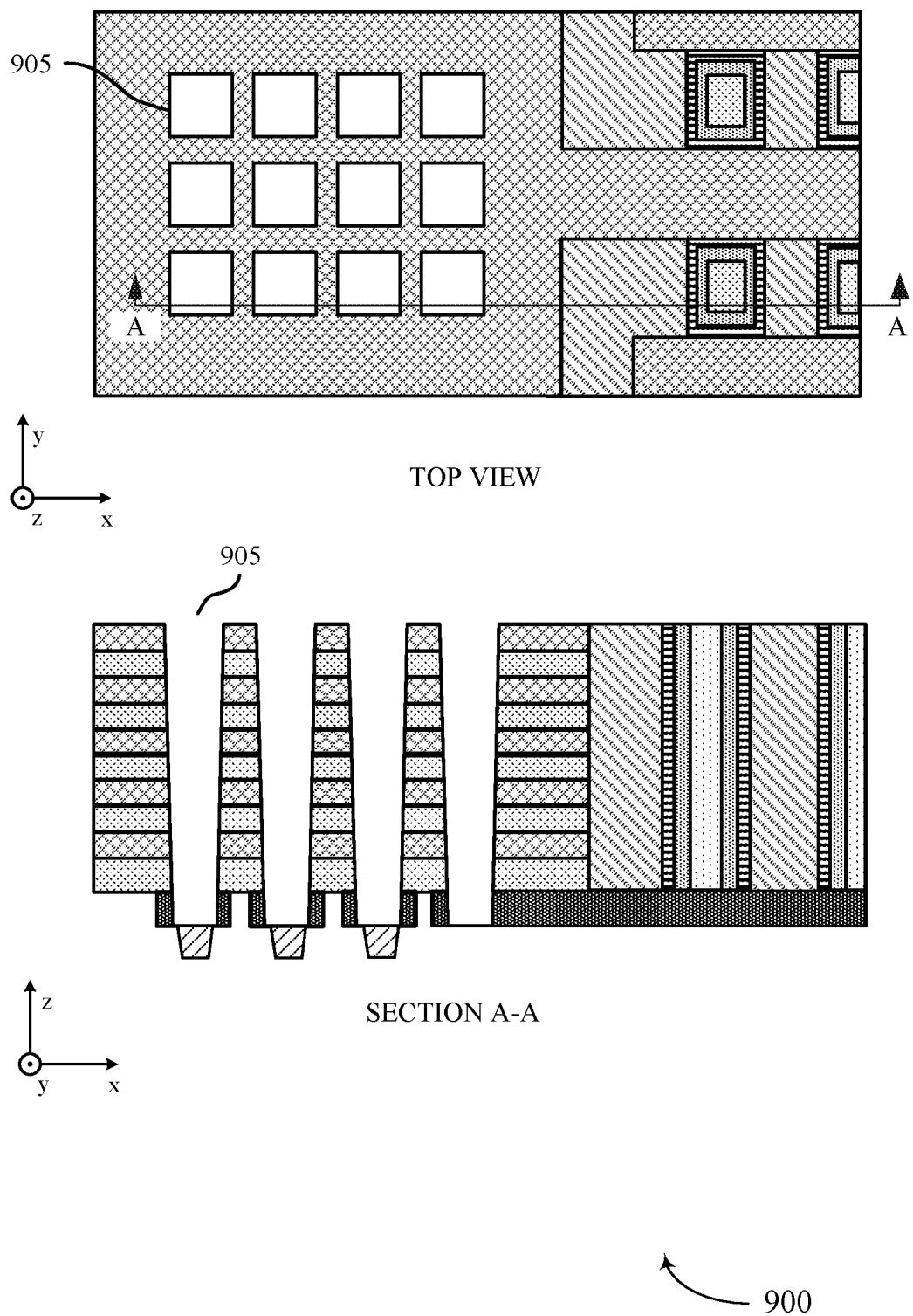
FIG. 9 illustrates an example of a layout that supports transition structures for three-dimensional memory arrays in accordance with examples as disclosed herein.

FIG. 9 illustrates an example of a top view and a cross-sectional view of a layered assembly 900 that supports transition structures for three-dimensional memory arrays in accordance with examples as disclosed herein. The set of manufacturing operations may also include operations that support forming vias in the staircase region 650 that provide mechanical support and stability to the staircase region 650, the memory region 645, or both, and may be operable to couple a word line decoder with a word line plate (e.g., by way of a via 630). For example, the set of manufacturing operations may include forming (e.g., etching) a set of cavities 905 in the staircase region 650. In some cases, the set of cavities 905 may be etched to correspond to the first set of conductive contacts 625, the second set of conductive contacts 625, or both. For example, forming the set of cavities 905 may expose at least a portion of a surface of respective conductive contacts 625, respective conductive contacts 625, or both. Additionally or alternatively, the set of cavities 905 may extend at least partially into the respective conductive contacts 625, respective conductive contacts 625, or both. That is, the set of cavities may expose one or more sidewalls of respective conductive contacts 625, respective conductive contacts 625, or both, as depicted in FIG. 9. In some examples, a subset of the set of cavities 905 may include one or more rows of cavities 905 which expose at least a portion of the common conductor 635. For example, the subset may correspond to the vias 425, the vias 525, or both which merge with the common conductor 445, the common conductor 545, or both.

Figure 10:
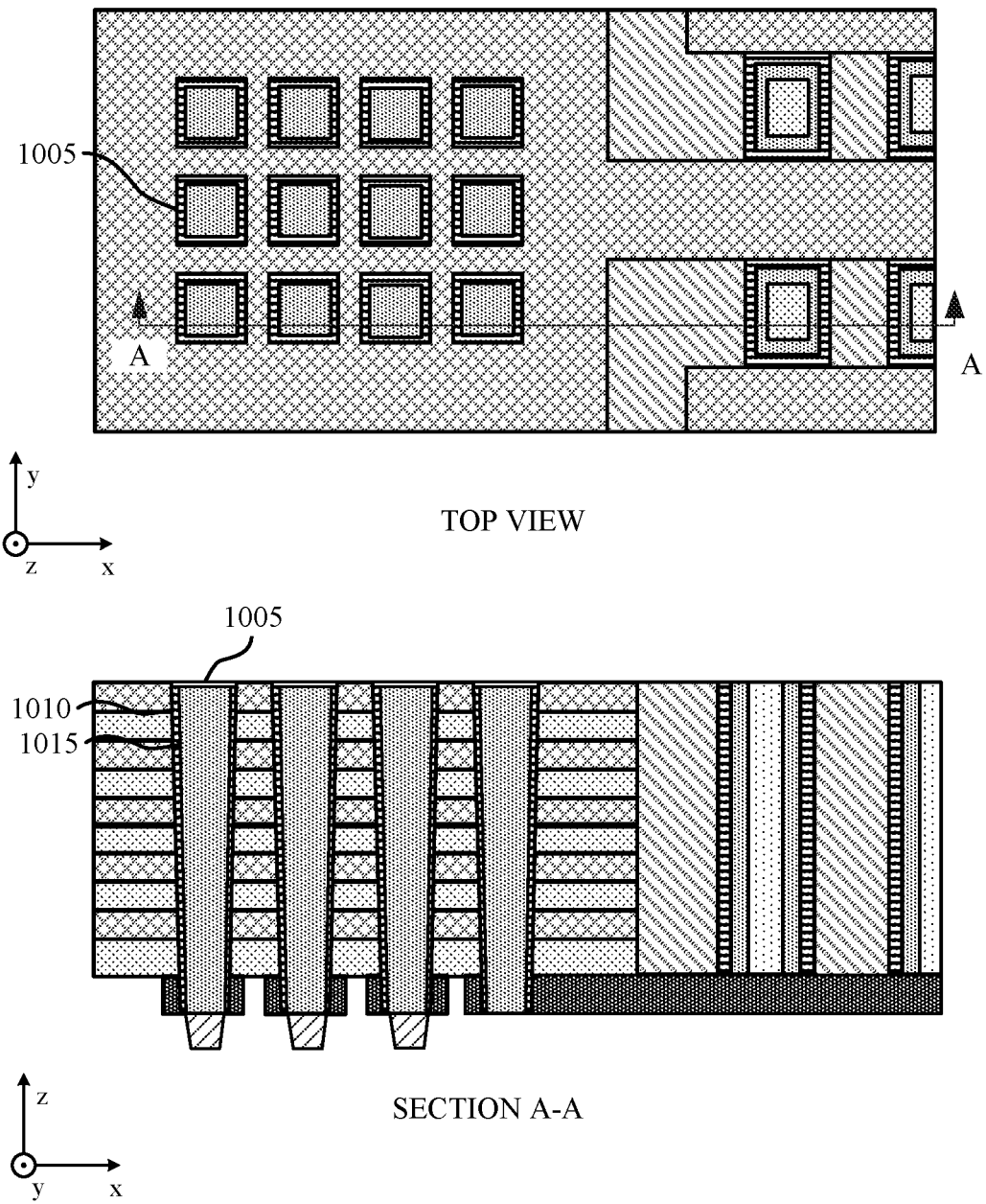
FIG. 10 illustrates an example of a layout that supports transition structures for three-dimensional memory arrays in accordance with examples as disclosed herein.

FIG. 10 illustrates an example of a top view and two cross-sectional views of a layered assembly 1000 that supports transition structures for three-dimensional memory arrays in accordance with examples as disclosed herein. The set of manufacturing operations may also include operations that support depositing a conductive material in the set of cavities 905 to form the vias 1005. For example, the set of manufacturing operations may include depositing an isolating material 1010, such as dielectric liner material or oxide liner material, which may substantially cover the sidewalls of each cavity 905 of the set of cavities 905 and function to electrically isolate the via 1005 from the stack of layers 605. Additionally, the set of manufacturing operations may include depositing a conductive material 1015 (e.g., an oxide material) in each cavity 905 of the set of cavities 905 to form the vias 1005. In some cases, the conductive material 1015 may be deposited to be electrically coupled with a via 630.

In some examples, the set of manufacturing operations may also include planarizing the stack of layers 605 and the vias 1005 (e.g., along with the materials 1010 and 1015), after deposition of the materials. In some examples, one or more materials (not shown) may be subsequently deposited over one or more of the stack of layers 605, the vias 1005, the material 1010, and the conductive material 1015. For example, a dielectric material may be subsequently deposited. In some cases, the dielectric material may be etched to a top surface of a via 1005 and a conductive material may be deposited to form an upper layer strapping.

Figure 11:
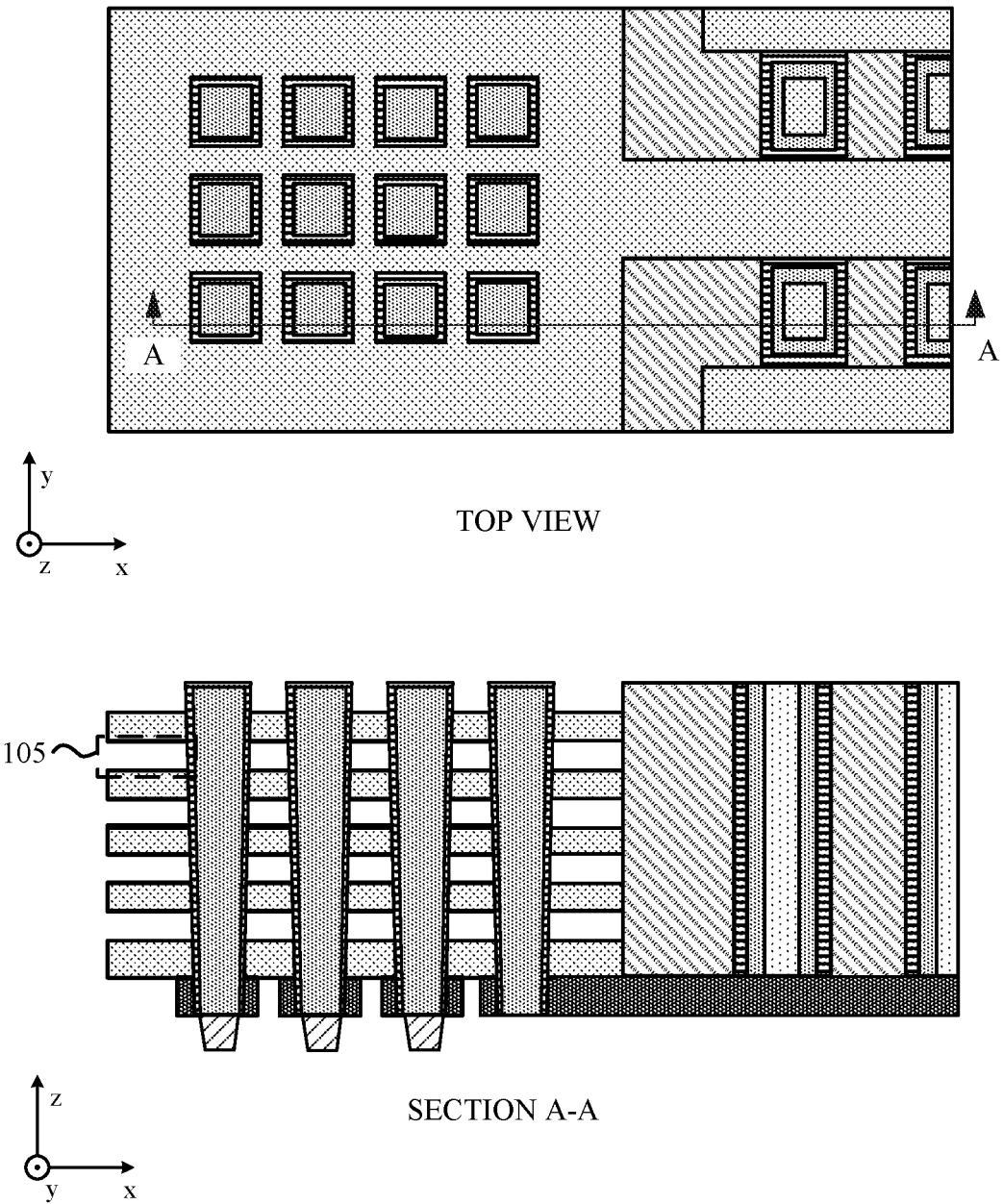
FIG. 11 illustrates an example of a layout that supports transition structures for three-dimensional memory arrays in accordance with examples as disclosed herein.

FIG. 11 illustrates an example of a top view and a cross-sectional view of a layered assembly 1100 that supports transition structures for three-dimensional memory arrays in accordance with examples as disclosed herein. The set of manufacturing operations may also include operations (e.g., exhumation operations, nitride exhumation) that support forming voids 1105 in the comb structures 710. For example, the set of manufacturing operations may include removing (e.g., etching, exhuming) the second material 620 from the first comb structure 710-a and the second comb structure 710-b, which may form a first set of voids 1105 between the layers of the first material 615 of the first comb structure 710-a, and a set of second voids 1105 between the layers of the first material 615 of the second comb structure 710-b.

The set of manufacturing operations may additionally include operations (e.g., exhumation operations, nitride exhumation) that support forming voids in the staircase region 650. For example, the set of manufacturing operations may include removing the second material 620 from the staircase region 650, which may form a set of voids 1105 between the layers of the first material 615 of the staircase region 650.

Figure 12:
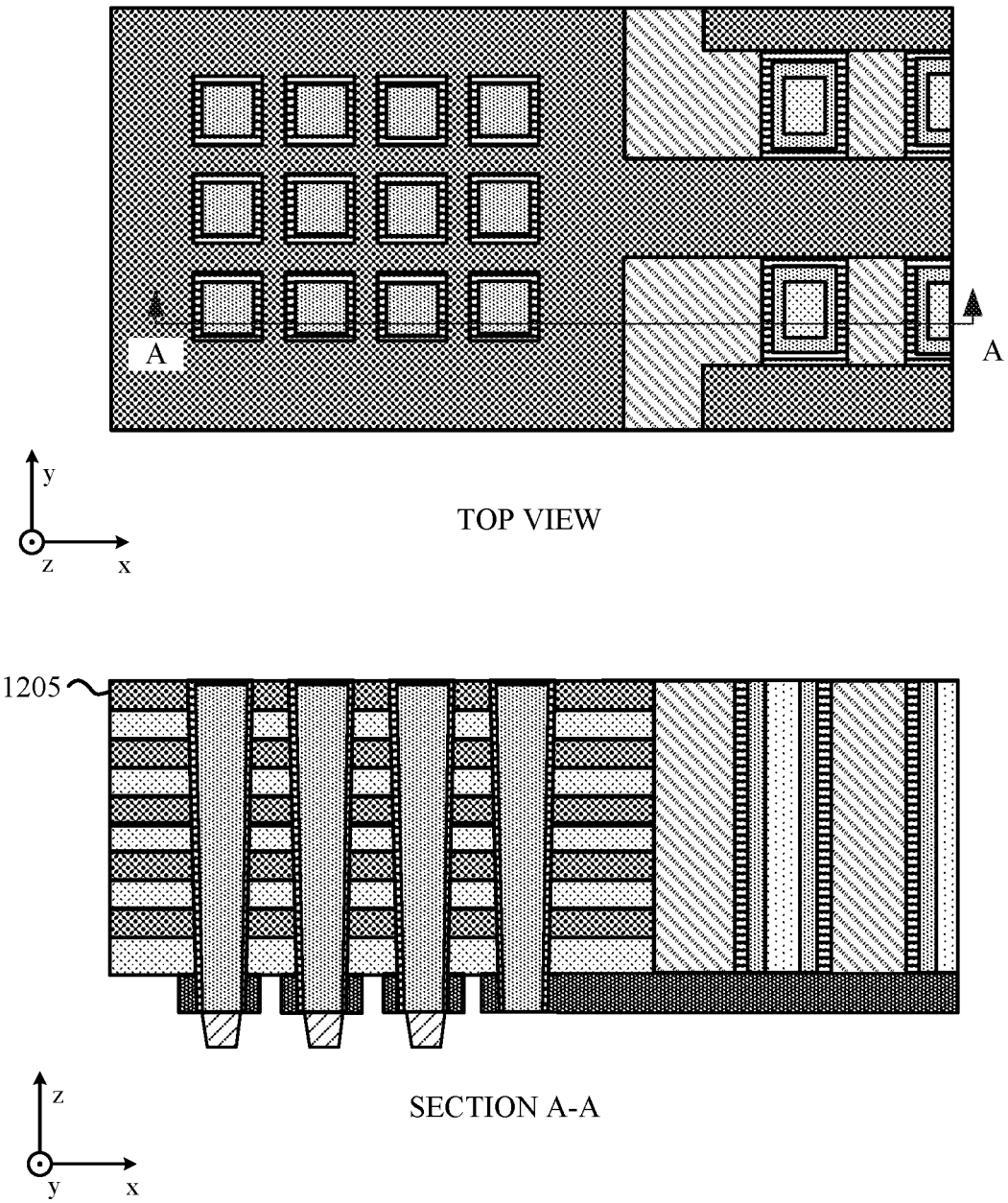
FIG. 12 illustrates an example of a layout that supports transition structures for three-dimensional memory arrays in accordance with examples as disclosed herein.

FIG. 12 illustrates an example of a top view and a cross-sectional view of a layered assembly 1200 that supports transition structures for three-dimensional memory arrays in accordance with examples as disclosed herein. The set of manufacturing operations may also include operations (e.g., one or more metal deposition operations) that support forming a plurality of word line members (e.g., at each level 230) based on depositing one or more conductive materials in the set of first voids 1105 and in the set of second voids 1105, respectively. For example, the set of manufacturing operations may include depositing a first conductive material 1205 on exposed surfaces of the stack of layers 605, which may include depositing the first conductive material 1205 in contact with the layers of the first material 615 of the first comb structure 710-a, in contact with the layers of the first material 615 of the second comb structure 710-b. In some examples, the first conductive material 1205 may include a barrier material (e.g., a conductive barrier, a liner material, a ceramic material) such as titanium nitride (TiN), titanium silicon nitride (TiSiN), tungsten silicon nitride (WSiN), or others.

In some examples, the set of manufacturing operations may also include depositing a second conductive material on exposed surfaces of the first conductive material 1205, which may include depositing the second conductive material in contact with the first conductive material 1205 to fill remaining portions of the set of first voids 1105. In some examples, the second conductive material may include a metal material, such as tungsten, or a metal alloy.

In some examples, the set of manufacturing operations may include depositing a single conductive material (e.g., omitting a barrier material), such as when the single conductive material is compatible with adjacent materials (e.g., compatible with the first material 615, compatible with a material deposited in contact with the single conductive material in a later operation). Additionally, the recessing may form the word line members and the word line plates.

Figure 13:
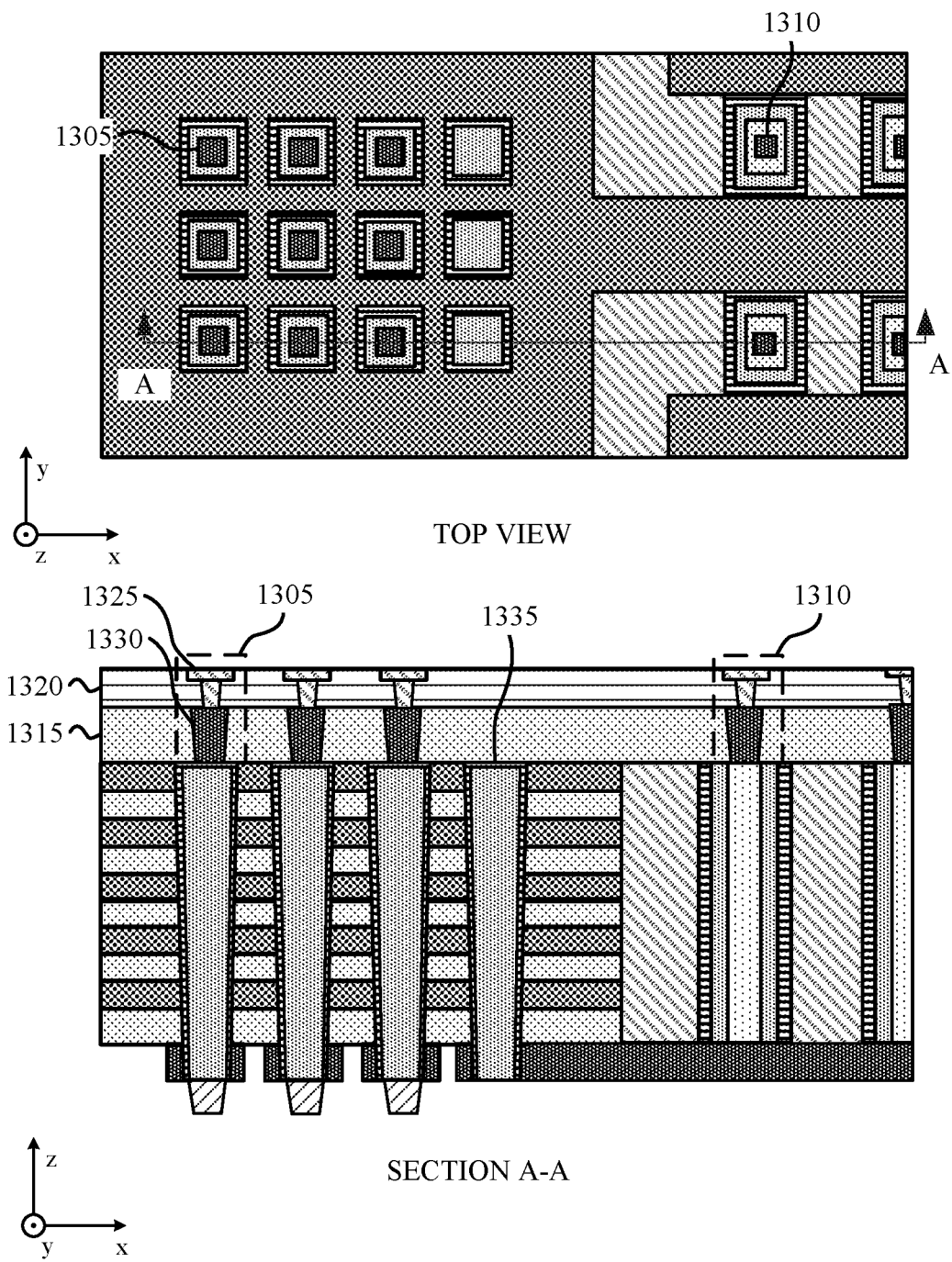
FIG. 13 illustrates an example of a layout that supports transition structures for three-dimensional memory arrays in accordance with examples as disclosed herein.

FIG. 13 illustrates an example of a top view and a cross-sectional view of a layered assembly 1300 that supports transition structures for three-dimensional memory arrays in accordance with examples as disclosed herein. The set of manufacturing operations may include forming a first set of contacts 1305 respectively coupled with the set of vias 1005 and forming a second set of contacts 1310 respectively coupled with the set of pillars 810. For example, the set of manufacturing operations may include depositing a first oxide layer 1315 on the layered assembly 1200, and a second oxide layer 1320 on the first oxide layer 1315.

In some cases, the set of manufacturing operations may include etching a of voids and subsequently depositing a first conductive material in each void of the set of voids to form a set of first vias 1330, which may be an example of the first via 555 as described with reference to FIGS. 5A and 5B. Additionally, the set of manufacturing operations may include depositing a second conductive material into the set of voids to form a second set of vias 1325, which may be examples of the second via 560 as described with reference to FIGS. 5A and 5B.

The layered assembly 1300 may include a set of vias 1335 which do not couple with a conductive contact 1305 or a conductive contact 1310. For example, the layered assembly 1300 may include one or more columns (e.g., in the y-direction) of vias 1335 which do not couple with a conductive contact 1305 or a conductive contact 1310. In some cases, the vias 1335 may land on or be positioned over the common conductor 635. Accordingly, the set of vias 1335 may be electrically isolated from the word line plates of the memory region 645.

Figure 14:
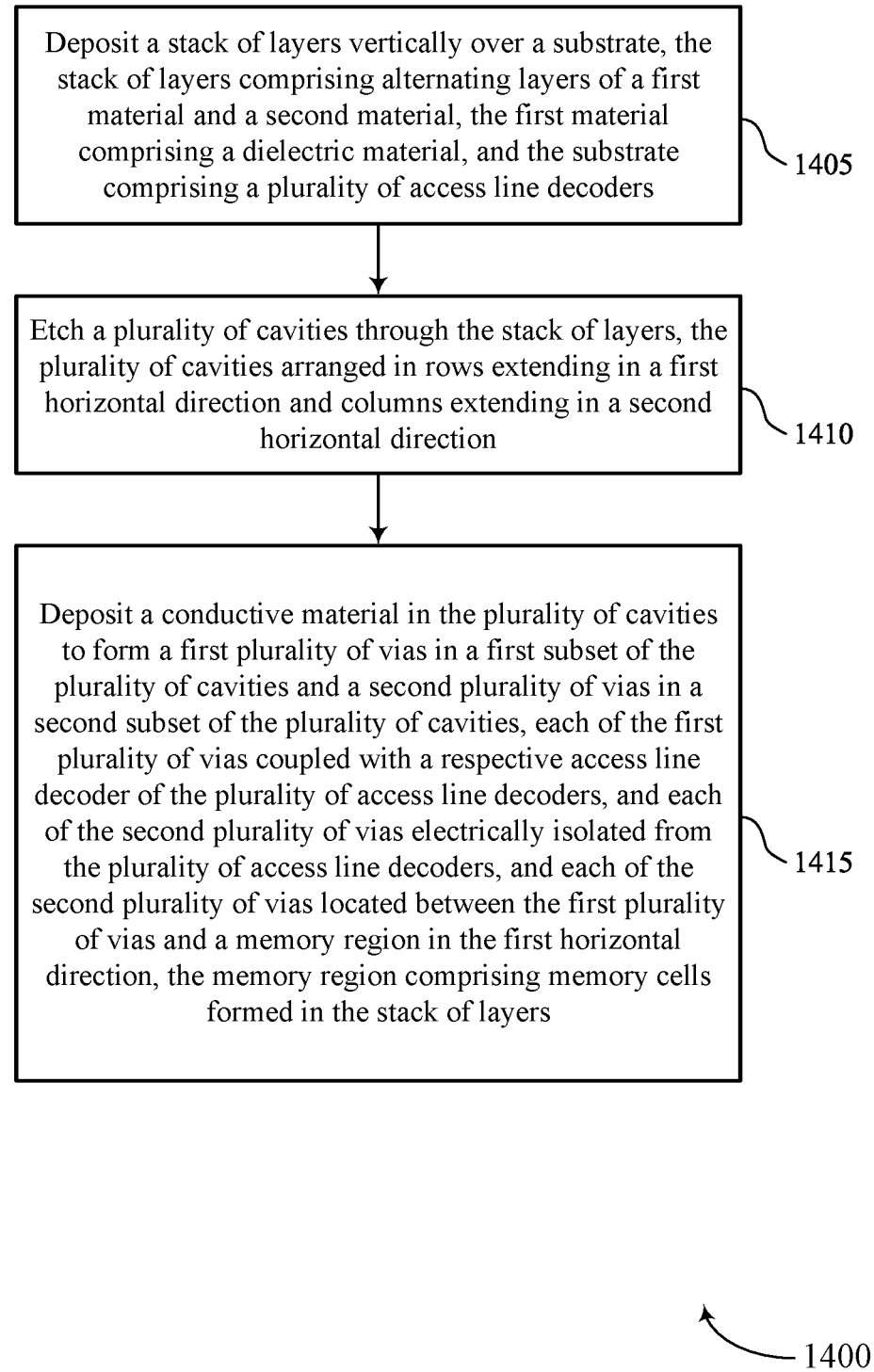
FIG. 14 shows a flowchart illustrating a method or methods that support transition structures for three-dimensional memory arrays in accordance with examples as disclosed herein.

FIG. 14 shows a flowchart illustrating a method 1400 that supports transition structures for three-dimensional memory arrays in accordance with examples as disclosed herein. The operations of method 1400 may be implemented by a process controller or its components as described herein. For example, the operations of method 1400 may be performed by a process controller as described with reference to FIGS. 1 through 13. In some examples, a process controller may execute a set of instructions to control the functional elements of the device to perform the described functions. Additionally, or alternatively, the process controller may perform aspects of the described functions using special-purpose hardware.

At 1405, the method may include depositing a stack of layers vertically over a substrate, the stack of layers including alternating layers of a first material and a second material, the first material including a dielectric material, and the substrate including a plurality of access line decoders. The operations of 1405 may be performed in accordance with examples as disclosed herein. In some examples, aspects of the operations of 1405 may be performed by a process controller.

At 1410, the method may include etching a plurality of cavities through the stack of layers, the plurality of cavities arranged in rows extending in a first horizontal direction and columns extending in a second horizontal direction. The operations of 1410 may be performed in accordance with examples as disclosed herein. In some examples, aspects of the operations of 1410 may be performed by a process controller.

At 1415, the method may include depositing a conductive material in the plurality of cavities to form a first plurality of vias in a first subset of the plurality of cavities and a second plurality of vias in a second subset of the plurality of cavities, each of the first plurality of vias coupled with a respective access line decoder of the plurality of access line decoders, and each of the second plurality of vias electrically isolated from the plurality of access line decoders, and each of the second plurality of vias located between the first plurality of vias and a memory region in the first horizontal direction, the memory region including memory cells formed in the stack of layers. The operations of 1415 may be performed in accordance with examples as disclosed herein. In some examples, aspects of the operations of 1415 may be performed by a process controller.

In some examples, an apparatus as described herein may perform a method or methods, such as the method 1400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for depositing a stack of layers vertically over a substrate, the stack of layers including alternating layers of a first material and a second material, the first material including a dielectric material, and the substrate including a plurality of access line decoders; etching a plurality of cavities through the stack of layers, the plurality of cavities arranged in rows extending in a first horizontal direction and columns extending in a second horizontal direction; and depositing a conductive material in the plurality of cavities to form a first plurality of vias in a first subset of the plurality of cavities and a second plurality of vias in a second subset of the plurality of cavities, each of the first plurality of vias coupled with a respective access line decoder of the plurality of access line decoders, and each of the second plurality of vias electrically isolated from the plurality of access line decoders, and each of the second plurality of vias located between the first plurality of vias and a memory region in the first horizontal direction, the memory region including memory cells formed in the stack of layers.

Aspect 2: The method, apparatus, or non-transitory computer-readable medium of aspect 1, further including operations, features, circuitry, logic, means, or instructions, or any combination thereof for etching a second plurality of cavities extending vertically through the memory region of the stack of layers; depositing a memory material in each cavity of the second plurality of cavities to form the memory cells; and depositing a plurality of pillars in the second plurality of cavities, each pillar respectively coupled with one or more of the memory cells.

Aspect 3: The method, apparatus, or non-transitory computer-readable medium of aspect 2, further including operations, features, circuitry, logic, means, or instructions, or any combination thereof for depositing a common conductor, the common conductor coupled with one or more of the second plurality of vias, and where the stack of layers is deposited over the common conductor.

Aspect 4: The method, apparatus, or non-transitory computer-readable medium of any of aspects 1 through 3, further including operations, features, circuitry, logic, means, or instructions, or any combination thereof for forming a plurality of contacts, each contact including a conductive material, where etching the plurality of cavities exposes at least a portion of each of the plurality of contacts.

Aspect 5: The method, apparatus, or non-transitory computer-readable medium of aspect 4, further including operations, features, circuitry, logic, means, or instructions, or any combination thereof for depositing a third plurality of vias, each via of the third plurality of vias coupled with a respective contact of the plurality of contacts, where the plurality of contacts are formed above the third plurality of vias.

Aspect 6: The method, apparatus, or non-transitory computer-readable medium of aspect 5 where each contact of the plurality of contacts overhangs a respective via of the third plurality of vias.

Aspect 7: The method, apparatus, or non-transitory computer-readable medium of any of aspects 4 through 6, further including operations, features, circuitry, logic, means, or instructions, or any combination thereof for forming a second plurality of contacts above the first plurality of vias, each contact including a second conductive material and coupled with a respective via of the first plurality of vias.

Aspect 8: The method, apparatus, or non-transitory computer-readable medium of aspect 7 where forming each contact of the second plurality of contacts further includes depositing a third conductive material positioned above the second conductive material and an oxide material positioned above the third conductive material and each contact of the second plurality of contacts is coupled with a respective via of the first plurality of vias.

Aspect 9: The method, apparatus, or non-transitory computer-readable medium of any of aspects 1 through 8 where depositing the conductive material in the plurality of cavities forms a third plurality of vias in a third subset of the plurality of cavities, the third plurality of vias arranged in a row extending in the second horizontal direction, each of the third plurality of vias electrically isolated from the plurality of access line decoders.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 10: An apparatus, including: a plurality of access line decoders at least partially in a substrate; a plurality of word line plates arranged vertically above the substrate and separated from each other by respective dielectric layers, each word line plate including a plurality of word line members that each extend in a first horizontal direction and into a memory region; a first plurality of vias extending vertically through the plurality of word line plates, the first plurality of vias arranged in rows extending in the first horizontal direction and columns extending in a second horizontal direction, each via of the first plurality of vias coupled with a respective access line decoder of the plurality of access line decoders; and a second plurality of vias extending vertically through the plurality of word line plates, each via of the second plurality of vias electrically isolated from the plurality of access line decoders, and a subset of the second plurality of vias arranged in a column extending in the second horizontal direction and in between the first plurality of vias and the memory region in the first horizontal direction.

Aspect 11: The apparatus of aspect 10, further including: a plurality of pillars extending vertically through the memory region, each pillar coupled with one or more memory cells of the memory region.

Aspect 12: The apparatus of aspect 11, further including: a common conductor arranged below the plurality of pillars and above the substrate, where the common conductor is coupled with each via of the subset of the second plurality of vias.

Aspect 13: The apparatus of any of aspects 10 through 12, further including: a plurality of contacts arranged beneath the first plurality of vias, each contact including a conductive material and coupled with a respective via of the first plurality of vias.

Aspect 14: The apparatus of aspect 13, further including: a third plurality of vias arranged beneath the plurality of contacts, each via of the third plurality of vias coupled with a respective contact of the plurality of contacts.

Aspect 15: The apparatus of aspect 14, where each contact of the plurality of contacts overhangs a respective via of the third plurality of vias.

Aspect 16: The apparatus of any of aspects 13 through 15, further including: a second plurality of contacts arranged beneath the second plurality of vias, each contact of the second plurality of contacts including the conductive material and coupled with a respective via of the second plurality of vias.

Aspect 17: The apparatus of any of aspects 13 through 16, further including: a second plurality of contacts arranged above the first plurality of vias, each contact including a second conductive material and coupled with a respective via of the first plurality of vias.

Aspect 18: The apparatus of aspect 17, further including: a third conductive material positioned above the second conductive material and an oxide material positioned above the third conductive material.

Aspect 19: The apparatus of any of aspects 10 through 18, further including: a third plurality of vias extending vertically through the plurality of word line plates, the third plurality of vias arranged in a row extending in the first horizontal direction, each of the third plurality of vias electrically isolated from the plurality of access line decoders.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a plurality of access line decoders at least partially in a substrate;
a plurality of word line plates arranged vertically above the substrate and separated from each other by respective dielectric layers, each word line plate comprising a plurality of word line members that each extend in a first horizontal direction and into a memory region;
a first plurality of vias extending vertically through the plurality of word line plates, the first plurality of vias arranged in rows extending in the first horizontal direction and columns extending in a second horizontal direction, each via of the first plurality of vias coupled with a respective access line decoder of the plurality of access line decoders; and
a second plurality of vias extending vertically through the plurality of word line plates, each via of the second plurality of vias electrically isolated from the plurality of access line decoders, and a subset of the second plurality of vias arranged in a column extending in the second horizontal direction and in between the first plurality of vias and the memory region in the first horizontal direction.

2. The apparatus of claim 1, further comprising:
a plurality of pillars extending vertically through the memory region, each pillar coupled with one or more memory cells of the memory region.

3. The apparatus of claim 2, further comprising:
a common conductor arranged below the plurality of pillars and above the substrate, wherein the common conductor is coupled with each via of the subset of the second plurality of vias.

4. The apparatus of claim 1, further comprising:
a plurality of contacts arranged beneath the first plurality of vias, each contact comprising a conductive material and coupled with a respective via of the first plurality of vias.

5. The apparatus of claim 4, further comprising:
a third plurality of vias arranged beneath the plurality of contacts, each via of the third plurality of vias coupled with a respective contact of the plurality of contacts.

6. The apparatus of claim 5, wherein each contact of the plurality of contacts overhangs a respective via of the third plurality of vias.

7. The apparatus of claim 4, further comprising:
a second plurality of contacts arranged beneath the second plurality of vias, each contact of the second plurality of contacts comprising the conductive material and coupled with a respective via of the second plurality of vias.

8. The apparatus of claim 4, further comprising:
a second plurality of contacts arranged above the first plurality of vias, each contact comprising a second conductive material and coupled with a respective via of the first plurality of vias.

9. The apparatus of claim 8, further comprising:
a third conductive material positioned above the second conductive material and an oxide material positioned above the third conductive material.

10. The apparatus of claim 1, further comprising:
a third plurality of vias extending vertically through the plurality of word line plates, the third plurality of vias arranged in a row extending in the first horizontal direction, each of the third plurality of vias electrically isolated from the plurality of access line decoders.

11. A method, comprising:
depositing a stack of layers vertically over a substrate, the stack of layers comprising alternating layers of a first material and a second material, the first material comprising a dielectric material, and the substrate comprising a plurality of access line decoders;
etching a plurality of cavities through the stack of layers, the plurality of cavities arranged in rows extending in a first horizontal direction and columns extending in a second horizontal direction; and
depositing a conductive material in the plurality of cavities to form a first plurality of vias in a first subset of the plurality of cavities and a second plurality of vias in a second subset of the plurality of cavities, each of the first plurality of vias coupled with a respective access line decoder of the plurality of access line decoders, and each of the second plurality of vias electrically isolated from the plurality of access line decoders, and each of the second plurality of vias located between the first plurality of vias and a memory region in the first horizontal direction, the memory region comprising memory cells formed in the stack of layers.

12. The method of claim 11, further comprising:
etching a second plurality of cavities extending vertically through the memory region of the stack of layers;
depositing a memory material in each cavity of the second plurality of cavities to form the memory cells; and
depositing a plurality of pillars in the second plurality of cavities, each pillar respectively coupled with one or more of the memory cells.

13. The method of claim 12, further comprising:
depositing a common conductor, the common conductor coupled with one or more of the second plurality of vias, and wherein the stack of layers is deposited over the common conductor.

14. The method of claim 11, further comprising:
forming a plurality of contacts, each contact comprising a conductive material, wherein etching the plurality of cavities exposes at least a portion of each of the plurality of contacts.

15. The method of claim 14, further comprising:
depositing a third plurality of vias, each via of the third plurality of vias coupled with a respective contact of the plurality of contacts, wherein the plurality of contacts are formed above the third plurality of vias.

16. The method of claim 15, wherein each contact of the plurality of contacts overhangs a respective via of the third plurality of vias.

17. The method of claim 14, further comprising:
forming a second plurality of contacts above the first plurality of vias, each contact comprising a second conductive material and coupled with a respective via of the first plurality of vias.

18. The method of claim 17, wherein forming each contact of the second plurality of contacts further comprises depositing a third conductive material positioned above the second conductive material and an oxide material positioned above the third conductive material, each contact of the second plurality of contacts is coupled with a respective via of the first plurality of vias.

19. The method of claim 11, wherein depositing the conductive material in the plurality of cavities forms a third plurality of vias in a third subset of the plurality of cavities, the third plurality of vias arranged in a row extending in the second horizontal direction, each of the third plurality of vias electrically isolated from the plurality of access line decoders.

20. A memory array formed by a process comprising:
depositing a stack of layers vertically over a substrate, the stack of layers comprising alternating layers of a first material and a second material, the first material comprising a dielectric material, and the substrate comprising a plurality of access line decoders;
etching a plurality of cavities through the stack of layers, the plurality of cavities arranged in rows extending in a first horizontal direction and columns extending in a second horizontal direction; and
depositing a conductive material in the plurality of cavities to form a first plurality of vias in a first subset of the plurality of cavities and a second plurality of vias in a second subset of the plurality of cavities, each of the first plurality of vias coupled with a respective access line decoder of the plurality of access line decoders, and each of the second plurality of vias electrically isolated from the plurality of access line decoders, and each of the second plurality of vias located between the first plurality of vias and a memory region in the first horizontal direction, the memory region comprising memory cells formed in the stack of layers.

21. The memory array of claim 20, wherein the process further comprises:

etching a second plurality of cavities extending vertically through the memory region of the stack of layers;

depositing a memory material in each cavity of the second plurality of cavities to form the memory cells; and depositing a plurality of pillars in the second plurality of cavities, each pillar respectively coupled with one or more of the memory cells.

22. The memory array of claim 21, wherein the process further comprises:

depositing a common conductor, the common conductor coupled with one or more of the second plurality of vias, and wherein the stack of layers is deposited over the common conductor.

23. The memory array of claim 20, wherein the process further comprises:

forming a plurality of contacts, each contact comprising a conductive material, wherein etching the plurality of cavities exposes at least a portion of each of the plurality of contacts.

24. The memory array of claim 23, wherein the process further comprises:

depositing a third plurality of vias, each via of the third plurality of vias coupled with a respective contact of the plurality of contacts, wherein the plurality of contacts are formed above the third plurality of vias.

25. The memory array of claim 20, wherein depositing the conductive material in the plurality of cavities forms a third plurality of vias in a third subset of the plurality of cavities, the third plurality of vias arranged in a row extending in the second horizontal direction, each of the third plurality of vias electrically isolated from the plurality of access line decoders.

* * * * *